United States Patent [19]
Comita et al.

[11] Patent Number: 5,914,050
[45] Date of Patent: Jun. 22, 1999

[54] PURGED LOWER LINER

[75] Inventors: Paul B. Comita, Menlo Park; David K. Carlson, Santa Clara; Kimberly E. Klinck, San Francisco; Harold J. Mellen, III, Sunnyvale, all of Calif.

[73] Assignee: Applied Materials, Inc., Santa Clara, Calif.

[21] Appl. No.: 08/934,920

[22] Filed: Sep. 22, 1997

[51] Int. Cl.⁶ .................................................. C23C 16/00
[52] U.S. Cl. .............................................. 216/58; 118/715
[58] Field of Search ............................... 118/715; 216/58

[56] References Cited

U.S. PATENT DOCUMENTS

| | | | |
|---|---|---|---|
| 4,666,734 | 5/1987 | Kamiya | 118/719 |
| 5,065,698 | 11/1991 | Koike | 118/715 |

*Primary Examiner*—Richard Bueker
*Attorney, Agent, or Firm*—Blakely, Sokoloff Taylor & Zafman

[57] ABSTRACT

Chemical vapor deposition apparatus 10 which includes a chemical vapor deposition processing chamber 12 having a base ring 18 and upper and lower quartz windows 20 and 22, and a quartz liner 26 lining the base ring 18, wherein a purge channel 46 is formed, in an outer surface of the liner 26, to remove contaminant material from an interface between the base ring 18 and the liner 26.

24 Claims, 6 Drawing Sheets

5,914,050

PURGED LOWER LINER

BACKGROUND OF THE INVENTION

This invention relates to a chemical vapor deposition apparatus and to a method of clearing material from between an inner wall of a chemical vapor deposition chamber and an outer surface of a chamber liner.

A chemical vapor deposition apparatus generally includes a chemical vapor processing chamber which is required to be as free as possible of contaminant gases and material (hereinafter generally referred to as "contaminants"). However, it is sometimes required that a component be positioned within the processing chamber so as to line an inner wall thereof, resulting in a volume or an interface, between the inner wall and the component, in which contaminant material collects.

For example, FIG. 1 of the accompanying drawings illustrates a conventional chemical vapor deposition apparatus 10 which includes a chemical vapor deposition processing chamber 12, equipment 14 for handling a wafer within the processing chamber 12, and lamps 16 located above and below the processing chamber 12.

The processing chamber 12 includes a stainless steel base ring 18, and upper and lower quartz windows 20 and 22, respectively sealing circumferentially within opposing sides of the base ring 18. An upper quartz liner ring 24 and a lower quartz liner ring 26 are located within the processing chamber 12. The upper liner ring 24 lines an upper part of the base ring 18 and a portion of the upper window 20, and the lower liner ring 26 lines a lower portion of the base ring 18 and a portion of the lower window 22. The purpose of the liner rings 24 and 26 is to protect the base ring from exposure to process gasses and severe temperature conditions within the processing chamber 12.

Processing gas inlet and outlet ports 28 and 30 are provided in opposing walls of the base ring 18. Processing gas inlet and outlet recesses, 32 and 34 respectively, are cut into sections of the circumference of the lower liner ring 26, thereby placing the inlet and outlet ports 28 and 30 in communication with the processing environment of the processing chamber 12.

During processing, a wafer is held in position by the equipment 14 and heated to a required temperature by the lamps 16. Process gas is then introduced into the processing chamber 12 through the inlet port 28 and allowed to react and form a deposited layer on the wafer. Replacement gas is then introduced through the inlet port 28 so that the process gas and any reaction byproducts are discharged through the outlet port 30.

The chemical vapor deposition apparatus 10 per se is known in the art and is therefore not further elaborated on herein. Suffice to say that it is required for the processing environment within the processing chamber 12 to be as free as possible of contaminants. However, it has been found that contaminants accumulate in spaces on an interface 36 between the base ring 18 and the lower quartz liner ring 26. It is known that these contaminants include iron oxide, resulting from oxidation and chemical deterioration of the base ring 18, chemical vapor deposition byproduct gases and materials, such as chlorine, and water.

FIG. 2 is a sectioned side view on 2—2 of FIG. 1, illustrating only the processing chamber 12. A slit 38 is formed through the base ring 18 and the lower liner ring 26, which is used for inserting wafers into and removing wafers from the processing chamber 12, and a thermocouple port 40 is formed through the base ring 18 and an interface between the upper liner ring 24 and the lower liner ring 26. The thermocouple port 40 is used for temperature calibration and is thereafter closed off be means of a plug 42.

FIGS. 3 and 4 illustrate the lower liner ring 26 from opposing sides, i.e. rotated through 180°, showing the process gas inlet and outlet recesses, 32 and 34 respectively, the thermocouple port 40 and the slit 38, as they are visible on the lower liner ring 26.

SUMMARY OF THE INVENTION

According to a first aspect of the invention there is provided a chemical vapor deposition apparatus which includes a chemical vapor deposition processing chamber, a liner on an inner wall of the chamber, wherein a purge channel is formed between the inner wall and the liner, an inlet port into the chamber to the purge channel, and an outlet port from the purge channel out of the chamber.

The chemical vapor deposition processing chamber preferably includes a base ring and first and second members which seal circumferentially with opposing sides of the base ring, respectively, and the liner is preferable a ring which lines the base ring.

According to a second aspect of the invention there is provided a method of clearing material from between a inner wall of a chemical vapor disposition chamber and a liner on the inner wall, which includes a step of purging the material through a channel formed between the liner and the inner wall.

According to a third aspect of the invention there is provided a chemical vapor deposition chamber liner which includes a ring defining a process gas outlet opening and a purge channel having a first portion in at least a part of an outer surface of the ring and a second portion connecting the first portion to the outlet opening.

According to a fourth aspect of the invention there is provided a chemical vapor deposition liner which includes a quartz ring defining a purge channel formed in a cylindrical outer surface thereof.

BRIEF DESCRIPTION OF THE DRAWINGS

The invention is further described by way of example with reference to the accompanying drawings wherein.

DESCRIPTION OF THE PREFERRED EMBODIMENT

A chemical vapor deposition apparatus is described. In the following description, for purposes of explanation, numerous specific details are set forth in order to provide a through understanding of the present invention, such the use of a chemical vapor deposition apparatus having a processing chamber with a specific configuration of parts of particular materials, a lower liner ring with a specific configuration and dimensions, a particular method of purging, and the use of specific gasses for purging purposes. It will be evident, however, to one skilled in the art that the present invention may be practiced without these specific details.

The present invention relates to a chemical vapor deposition apparatus which includes a chemical vapor deposition processing chamber having a base ring and upper and lower quartz windows, and a quartz liner ring lining the base ring, wherein a purge channel is formed, in an outer surface of the liner through which contaminants are purged from an interface between the base ring and the liner. The invention is now described in more detail with specific reference to FIGS. 5 to 8.

Figure 3:
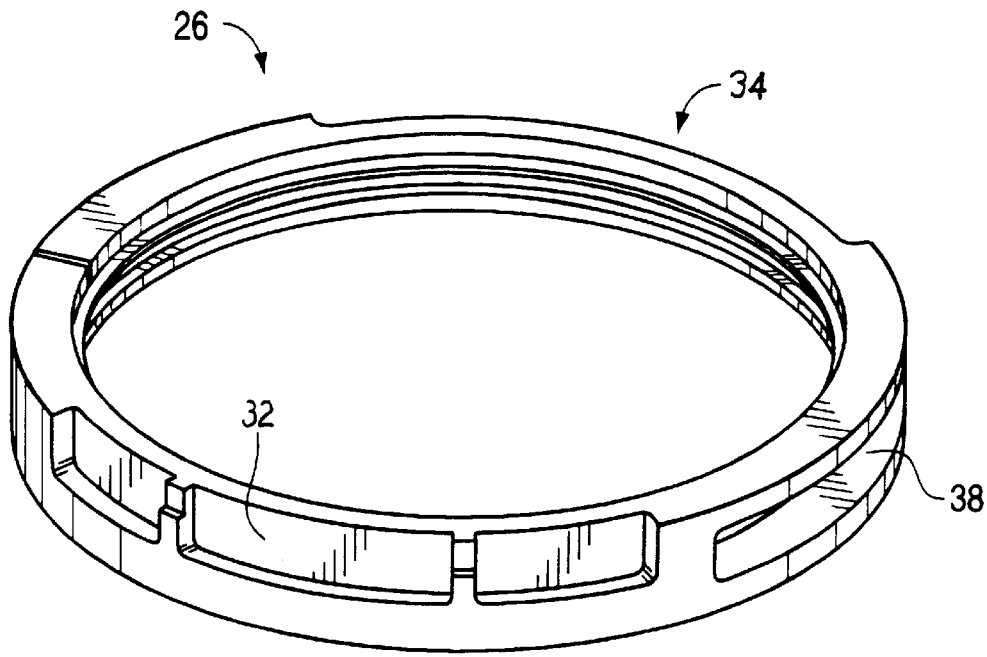
FIGS. 3 and 4 are perspective views, from opposing sides, of a conventional chemical vapor deposition chamber liner according.
Figure 4:
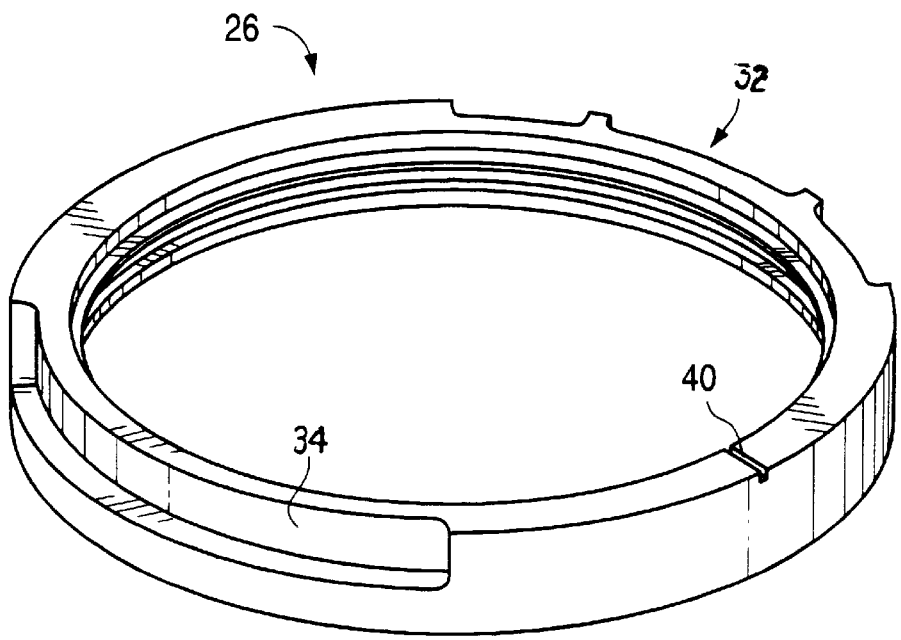
Figure 5:
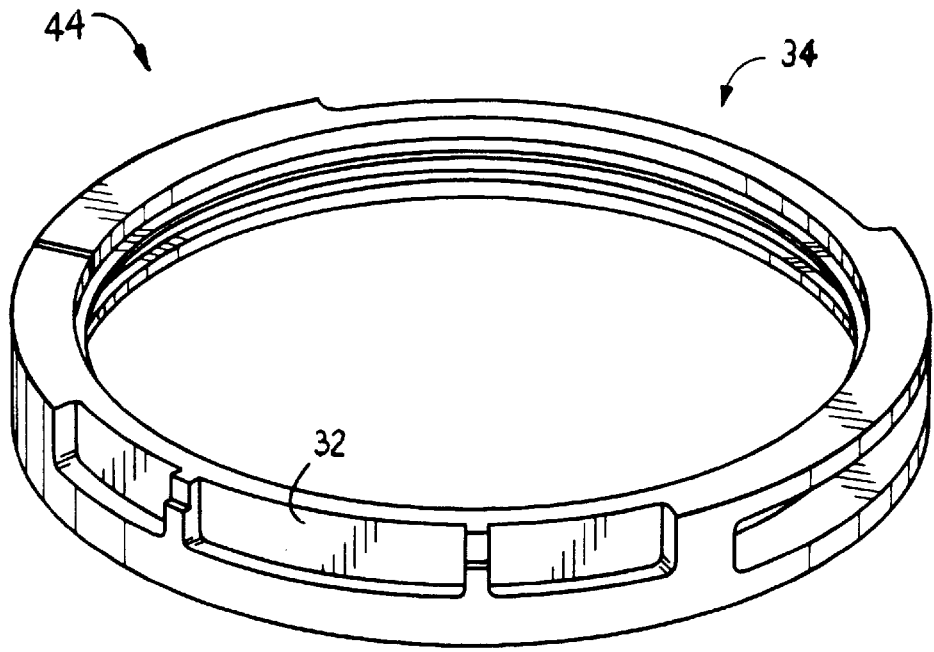
FIGS. 5 and 6 are views similar to FIGS. 3 and 4, receptively, showing a chemical vapor deposition chamber liner according to the invention.
Figure 6:
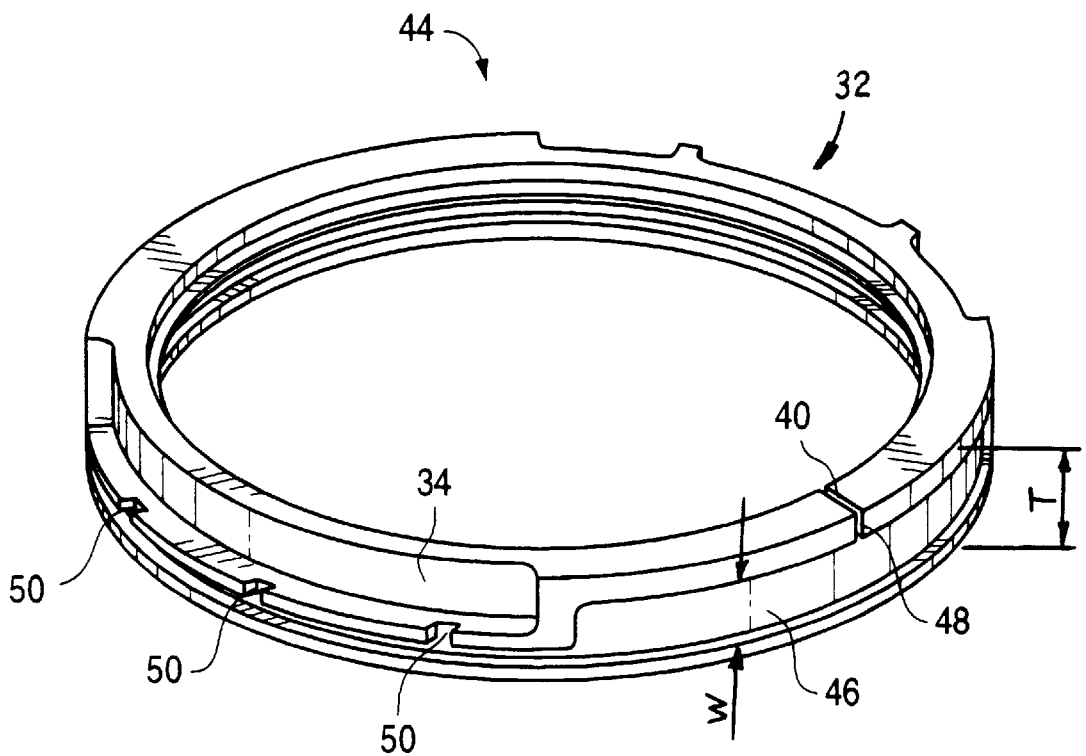

FIGS. 5 and 6 illustrate a lower liner ring 44 which is similar to the lower liner ring 26 of FIGS. 3 and 4, except that a channel 46 is cut in a part of cylindrical surface outer thereof. The channel 46 extends around more or less 180° of the lower liner ring 44 and is located in the region below the thermocouple port 40 and the process gas outlet recess 34. Small grooves 48 and 50 connect the channel with the thermocouple port 40 and the process gas outlet recess 34, respectively. The lower liner ring 44 has a thickness (T) of 40 mm and the channel 46 has a width (W), in the region of the thermocouple port 40, of about 21 mm.

Figure 2:
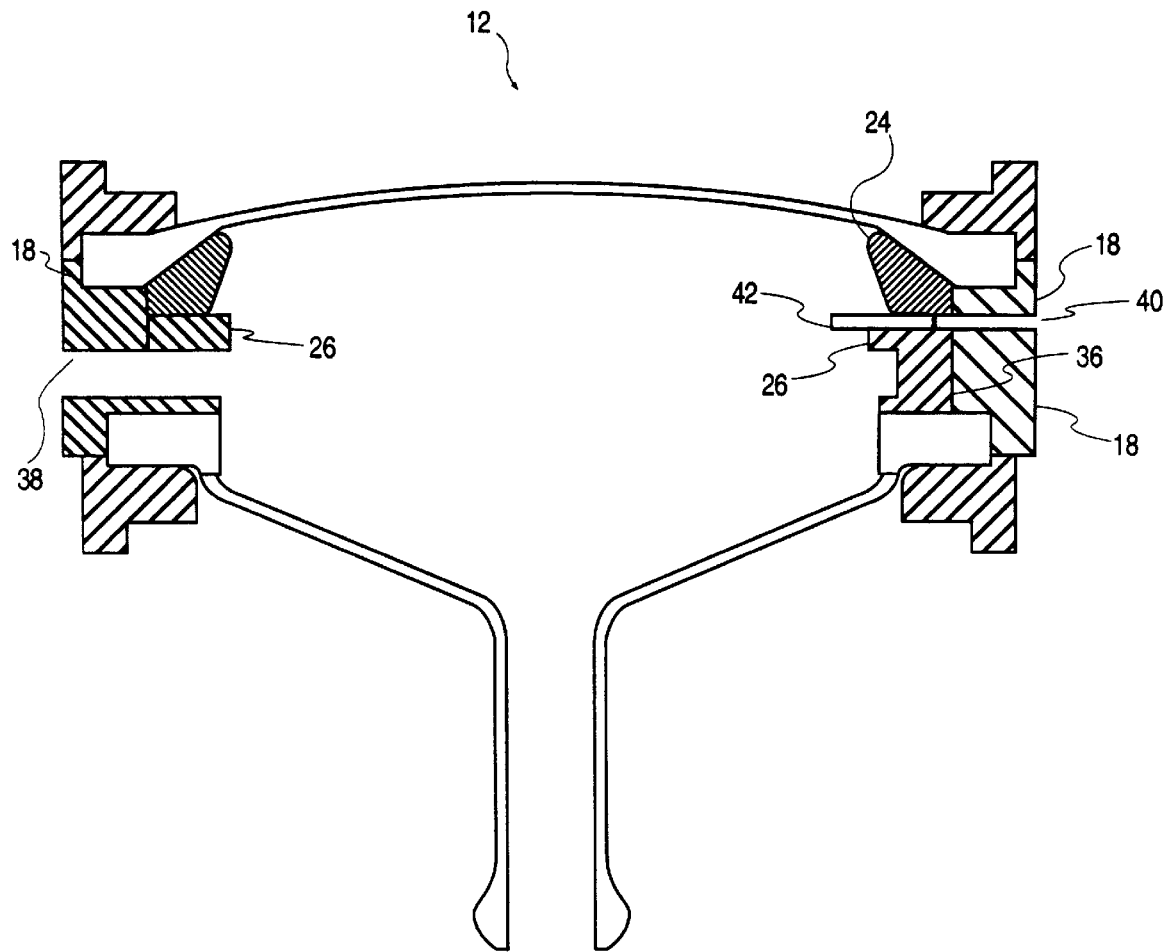
FIG. 2 is a sectioned side view on 2—2 of FIG. 1, showing only some of the parts of FIG. 1.
Figure 7:
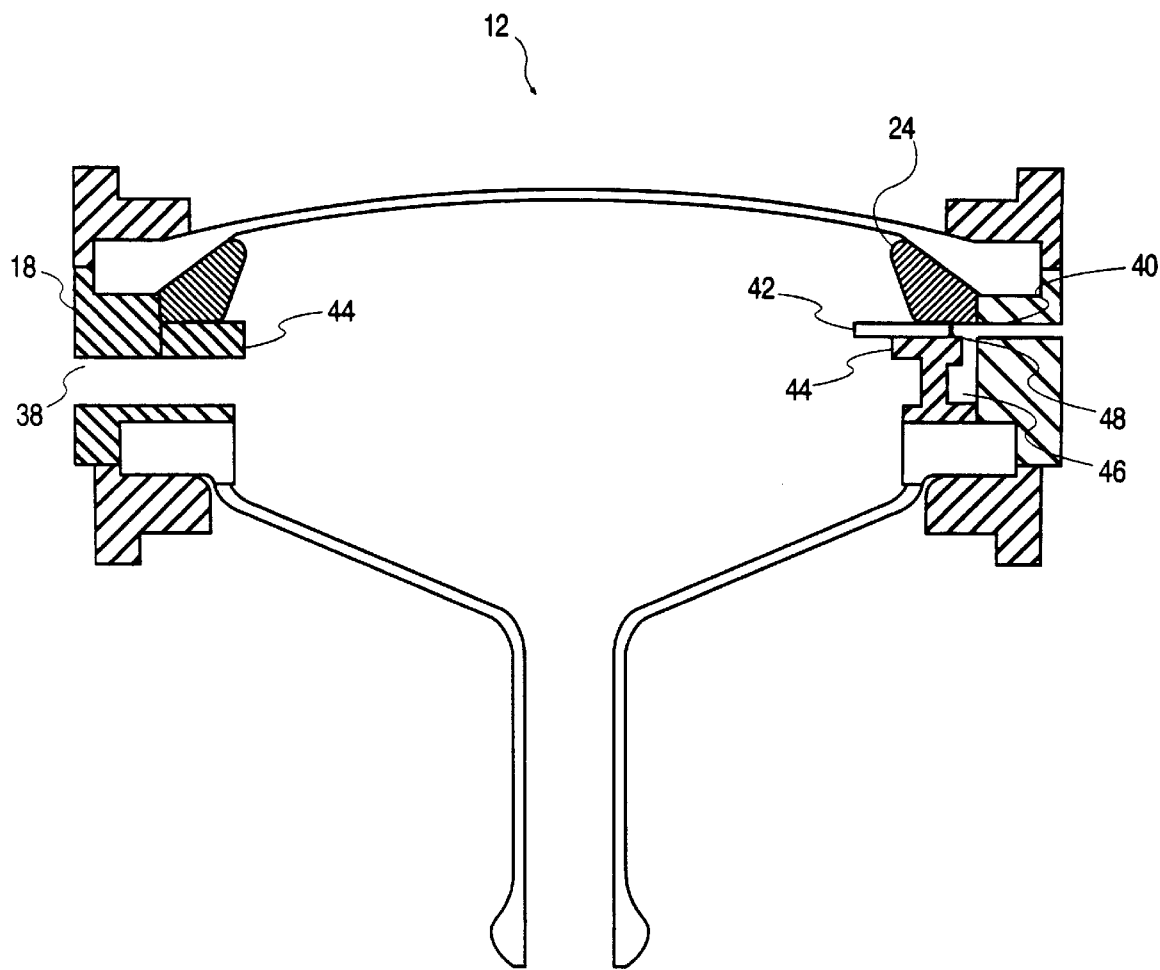
FIG. 7 is a view similar to FIG. 2, incorporating the liner of FIGS. 5 and 6.

FIG. 7 illustrates a processing chamber 12 wherein the lower liner ring 26, of FIG. 2, has been replaced with the lower liner ring 44 of FIGS. 5 and 6, so that the channel 46 is located between the lower liner 44 ring and the base ring 18. The channel 46 is placed in communication with the thermocouple port 40 via the groove 48.

Figure 1:
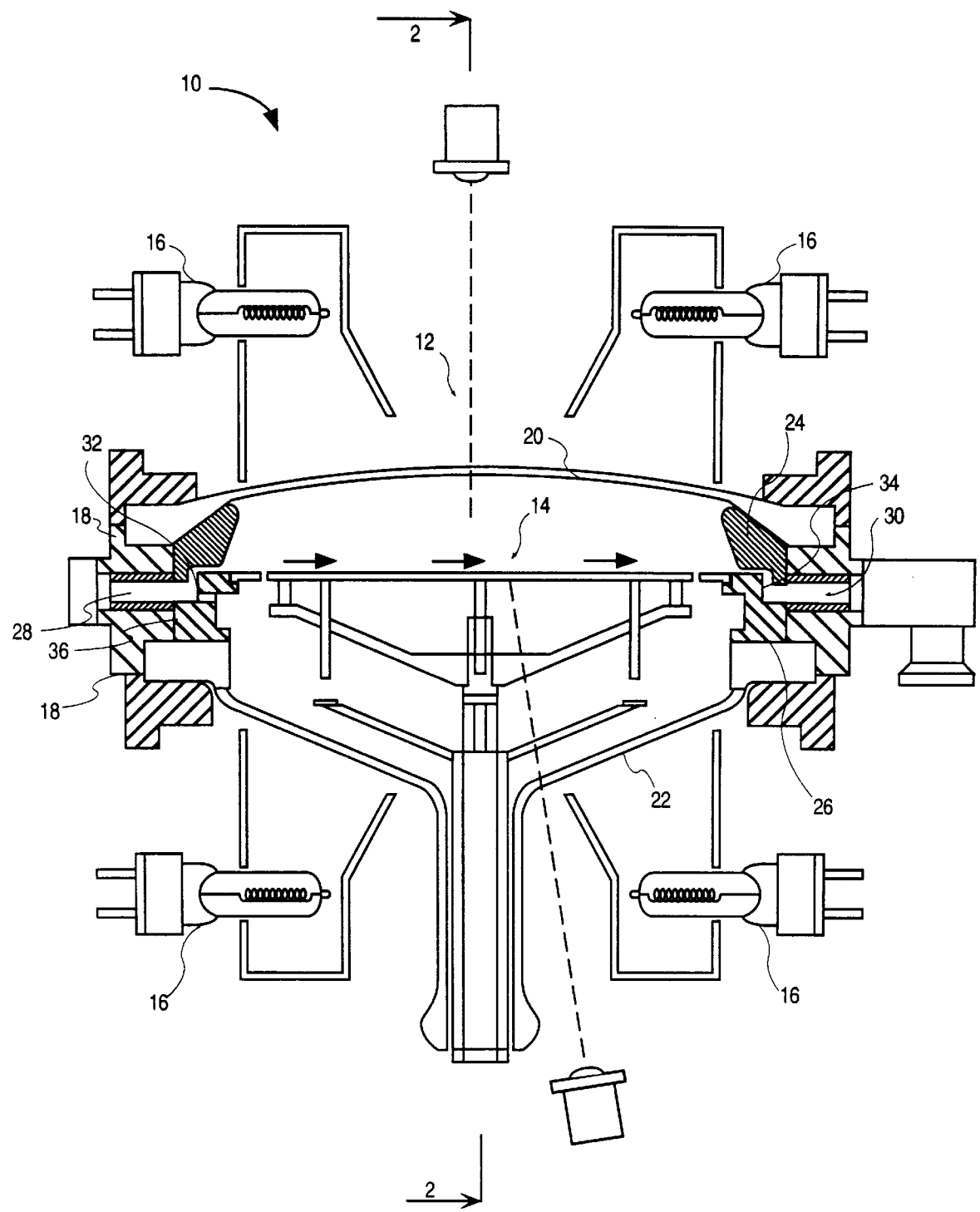
FIG. 1 is a sectioned side view of a conventional chemical vapor disposition apparatus.
Figure 8:
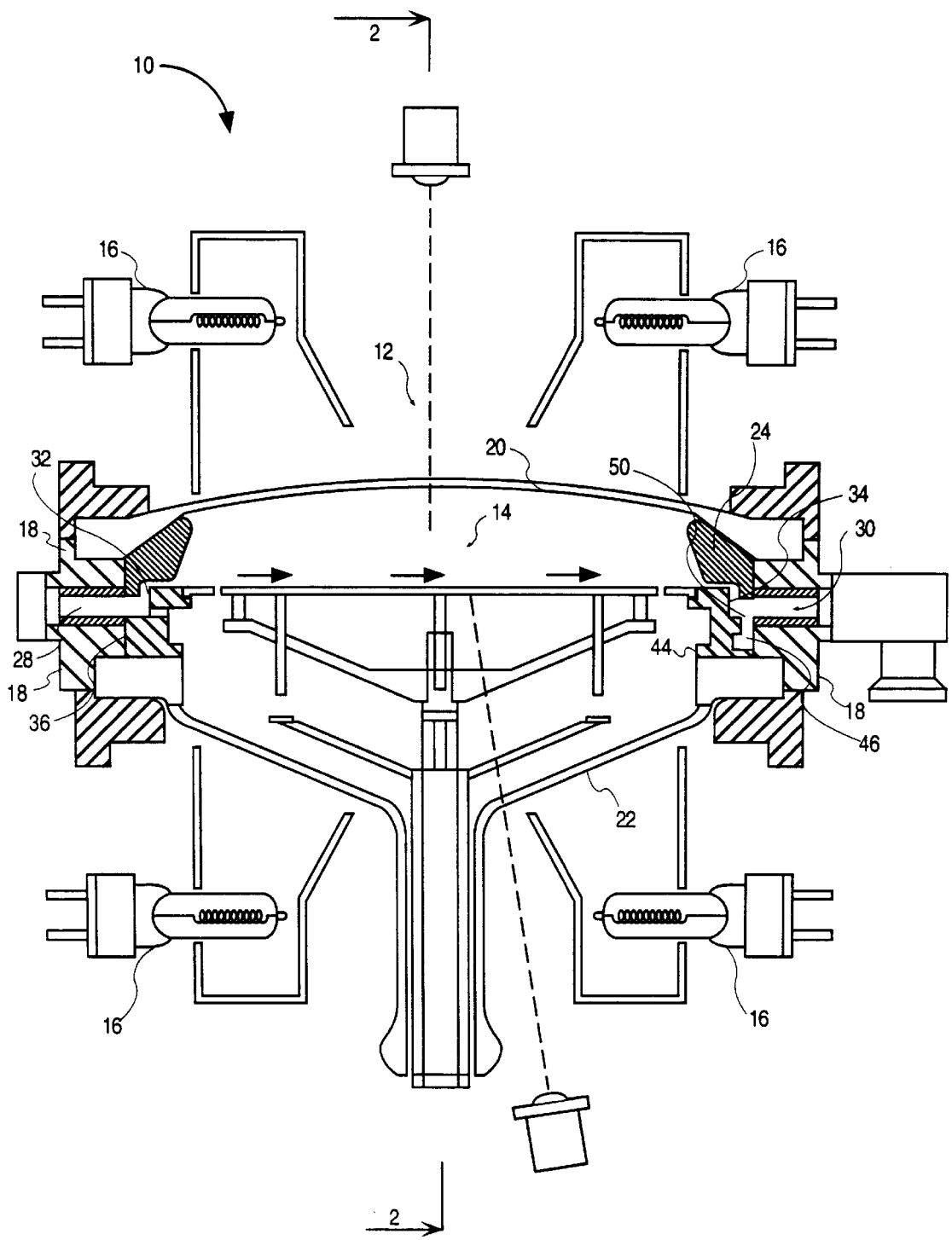
FIG. 8 is a view similar to FIG. 1, incorporation the liner of FIGS. 5 and 6.

FIG. 8 illustrates a chemical vapor disposition apparatus 10 similar to that of FIG. 1, but including the lower liner ring 44 of FIGS. 5 and 6. The channel 46 is placed in communication with the processing gas outlet port 30 by means of the grooves 50.

In use of the chemical vapor deposition apparatus purge gas is introduced into the channel 46 through the thermocouple port 40, flows through channel 46, and leaves the channel 46 from the grooves 50 connecting the channel 46 to the process gas outlet recess 34, from where it leaves the processing chamber 12 through the outlet port 30. Contaminants located between the base ring 18 and the lower liner ring 44 are so cleared. Applicant has found that a purge gas flow rate of between 1 and 50 liters per minute is adequate. Because the channel 46 is only in the region of the thermocouple port 40 and the process gas outlet recess 34, the purge gas is controlled away from the inlet port 28, and therefore prevented from mixing with process gas introduced through the inlet port 28, which could cause negative deposition effects, and retained in the region of the outlet port 30 where the majority of chemical vapor deposition byproduct contaminants collect. It should be noted that the contaminants are cleared without the purge gas ever mixing with gas within the process environment of the processing chamber 12. That way different gases can be used for purging and processing purposes.

The purge gas may be an inert gas or may be a gas, such as HCl, $BCl_2$, $CCl_4$, $Cl_2$, $SCl_4$, $CF_4$, $SF_4$, $SF_6$, $CHF_3$ and $C_2F_6$, which is reactive with chlorine or other chemical vapor deposition byproduct gases. These gases are also called "etch gases" because of the vaporizing effect that they have on certain materials, in particular liquid and solid chemcial vapor deposition byproducts.

Alternatively, the purge gas may be hydrogen gas used during a hydrogen bake of the processing chamber 12, which generally occurs at between 800° C. and 1200° C.

Thus, a chemical vapor deposition apparatus has been described. Although the present invention has been described with reference to specific exemplary embodiments, it will be evident that various modifications and changes may be made to these embodiments without departing from the broader spirit and scope of the invention. Accordingly, the specification and drawings are to be regarded in an illustrative rather than a restrictive sense.

We claim:

1. A chemical vapor deposition apparatus which includes:
    a chemical vapor deposition processing chamber;
    a liner on an inner wall of the chamber, wherein a purge channel is formed between the inner wall and the liner;
    an inlet port into the chamber to the purge channel; and
    an outlet port from the purge channel out of the chamber.
2. The chemical vapor deposition apparatus of claim 1 wherein the chemical vapor deposition processing chamber includes:
    a base ring; and
    first and second members which seal circumferentially with opposing sides of the base ring, respectively, wherein the liner is a ring which lines the base ring.
3. The chemical vapor deposition apparatus of claim 2 wherein the liner ring at least partially lines the first component.
4. The chemical vapor deposition apparatus of claim 2 wherein the base ring is made of metal.
5. The chemical vapor deposition apparatus of claim 4 wherein the base ring is made of a steel alloy.
6. The chemical vapor deposition of claim 5 wherein the base ring is made of stainless steel.
7. The chemical vapor deposition apparatus of claim 1 wherein the purge channel is formed by a groove in the liner.
8. The chemical vapor deposition apparatus of claim 1 wherein the liner substantially isolates the purge channel from the processing environment of the chemical vapor deposition processing chamber.
9. A method of clearing material located between an inner wall of a chemical vapor deposition chamber and a liner on the inner wall, which includes the step of:
    purging the material through a channel formed between the inner wall and the liner.
10. The method of claim 9 wherein the material is purged with an inert gas.
11. The method of claim 9 wherein the material is purged with a gas which reacts with a chemical vapor deposition byproduct.
12. The method of claim 11 wherein the reacting gas is selected from the group consisting of HCl, $BCl_2$, $CCl_4$, $Cl_2$, $SCl_4$, $CF_4$, $SF_4$, $SF_6$, $CHF_3$ and $C_2F_6$.
13. The method of claim 11 wherein the neutralizing gas flows from the channel through an exhaust leading from the processing environment of the chemical vapor deposition chamber.
14. The method of claim 9 wherein the material is purged through the channel with a gas which is isolated from the process environment of the chemical vapor deposition chamber.
15. The method of claim 9 wherein the material includes iron oxide.
16. The method of claim 9 wherein the material is purged with a gas flowing at between 1 to 50 liters per minute.
17. The method of claim 9 wherein the material is purged with hydrogen gas.

18. The method of claim 17 wherein the hydrogen gas is at a temperature of between 25° C. and 1200° C.

19. A chemical vapor deposition chamber liner which includes:

a ring defining:
  a process gas outlet opening; and
  a purge channel having:
    a first portion in at least a part of an outer surface of the ring; and
    a second portion connecting the first portion to the outlet opening.

20. The chemical vapor deposition chamber liner of claim 19 wherein the ring is made of quartz.

21. The chemical vapor deposition chamber liner of claim 19 wherein the ring defines a process gas inlet opening.

22. The chemical vapor deposition liner of claim 19 wherein the process gas outlet opening is a recess formed in a section of the circumference of the ring.

23. The chemical vapor deposition liner of claim 19 wherein the first portion is formed in a cylindrical outer surface of the ring.

24. A chemical vapor deposition process chamber liner which includes:

a quartz ring defining a purge channel formed in a cylindrical outer surface thereof.

* * * * *